United States Patent [19]

Vig et al.

[11] Patent Number: 5,045,920

[45] Date of Patent: Sep. 3, 1991

[54] DUAL-HALL FERROUS-ARTICLE-PROXIMITY SENSOR

[75] Inventors: Ravi Vig, Concord, N.H.; Daniel P. Demingware, Ft. Wayne, Ind.; Aung T. Tu, Concord, N.H.

[73] Assignee: Allegro Microsystems, Inc., Worcester, Mass.

[21] Appl. No.: 545,168

[22] Filed: Jun. 28, 1990

[51] Int. Cl.⁵ .................. H01L 27/22; H01L 23/04
[52] U.S. Cl. ........................................ 357/74; 357/27
[58] Field of Search ............... 357/27, 74; 307/309, 307/278

[56] References Cited

U.S. PATENT DOCUMENTS

| 4,401,966 | 8/1983 | Ohmura et al. | 357/27 |
| 4,853,632 | 8/1989 | Nagano et al. | 357/27 |
| 4,939,499 | 7/1990 | Hara | 307/309 |

FOREIGN PATENT DOCUMENTS 0830991 12/1985 U.S.S.R. ................. 357/27

Primary Examiner—Rolf Hille
Assistant Examiner—S. V. Clark

[57] ABSTRACT

A ferrous article proximity sensor package includes a dual Hall element IC chip mounted at the end of a magnet. The axis of the chip, defined as being orthogonal to the chip face and equidistant the two Hall elements, is coaxial with the outer wells of the package but spaced away from the axis of the magnet. That exact position is such that the resulting difference in magnetic field strength at the two Hall elements is just enough to compensate for all the other factors that lead to an unwanted offset voltage in the sensor output. This package is made of two mating parts, one containing the magnet being eccentric with respect to the chip axis and the other containing the chip just above one magnet pole end. To achieve the abovedescribed desired offset condition in manufacturing, the one package part is simply rotated with the magnet relative to and within the other package part until the desired condition is met, and the two parts fastened together in that position.

5 Claims, 2 Drawing Sheets

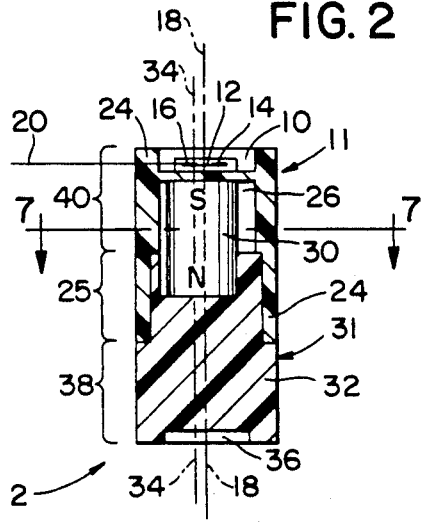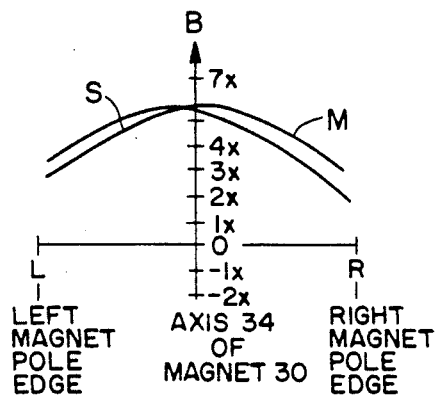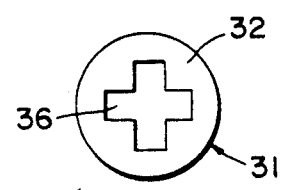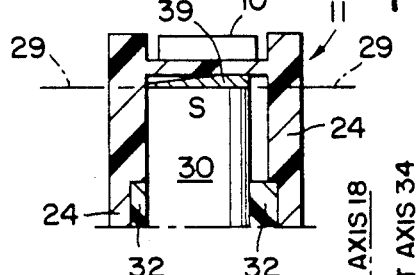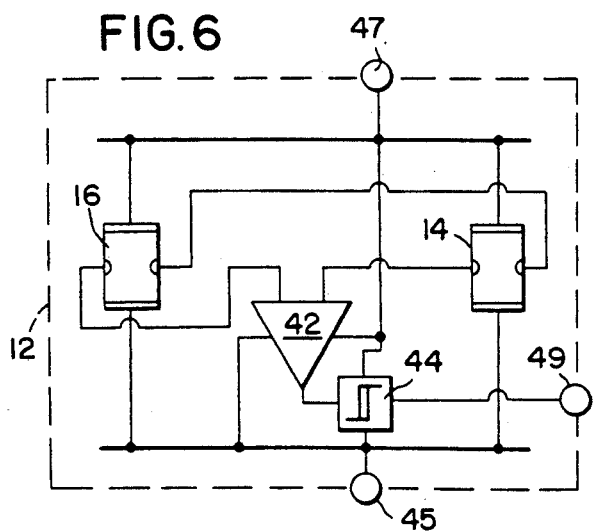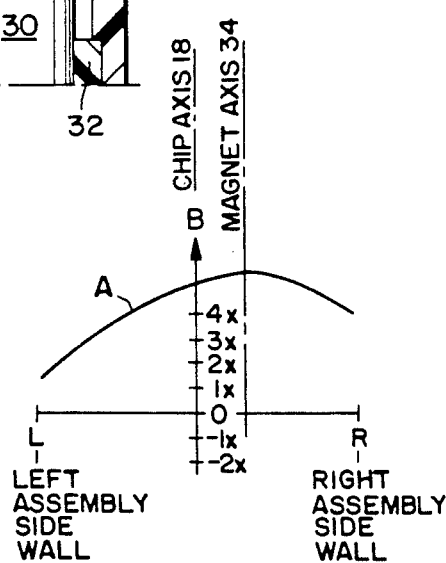

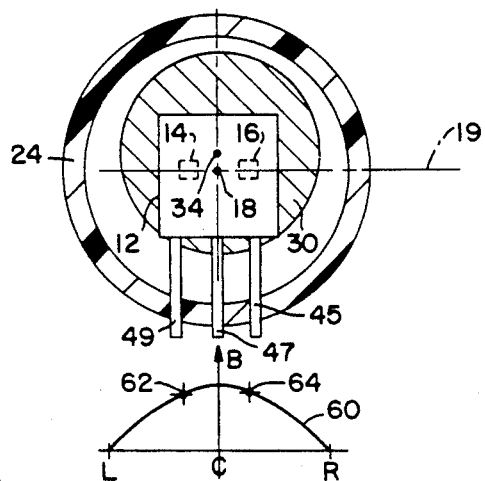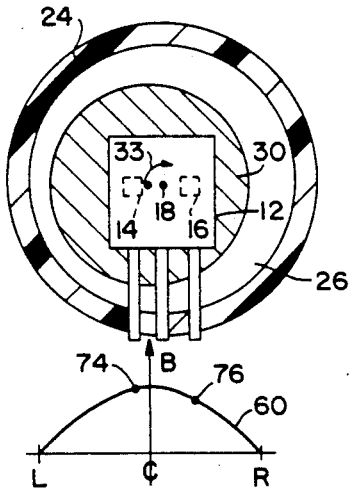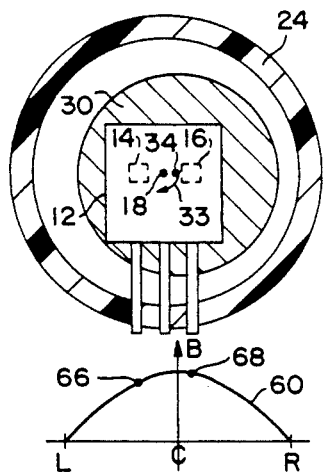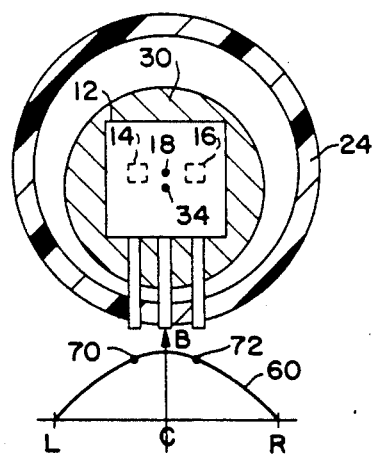

DUAL-HALL FERROUS-ARTICLE-PROXIMITY SENSOR

BACKGROUND OF THE INVENTION

This invention relates to a proximity sensor for detecting the passing of a ferromagnetic article such as gear teeth, and more particularly to such a sensor comprising an assembly of a magnet and an integrated circuit chip having two Hall elements with their outputs connected differentially, the chip being mounted at one pole end of the magnet.

The integrated circuit chips of such prior art proximity sensors almost always include an essentially linear Hall-voltage amplifier for amplifying the differential Hall output voltage. Also included in many such dual Hall integrated circuits is a Schmitt trigger circuit for producing a binary output signal that changes from one level (a standby level) to the other binary level (an action level) when a ferrous article approaches to within a critical distance at which the difference in the magnetic field, normal to a major face of the chip, exceeds a predetermined magnitude. These circuits are normally DC connected so that the sensor is capable of sensing passing ferrous articles at zero rate (e.g. one a year) up to a high rate (e.g. 100 KHz).

In the production of such sensors capable of sensing down to the zero rate, it has always been difficult to constantly obtain a zero output signal under the condition that there is no nearby ferrous article. Or, in the case of manufacturing a sensor to produce a binary signal of frequency corresponding to the passage of ferrous teeth in an adjacent rotating gear, wherein the mean value of the binary output signal is desirably near 50%, control of this mean value is also difficult for the same reasons: namely, that every factor that affects the output signal bias or offset must be controllable, and there are many such factors some of which are described below.

The offset of the differential output Hall voltage varies from integrated circuit chip to chip due to lack of repeatability of the dimensions of the Hall elements themselves. Slight misregistrations in successive mask registrations during manufacture of integrated circuits is but one of the numerous factors to which offset control is related. An approach for reducing the offset voltage in an integrated Hall element entailing surrounding the Hall element by a stress equalizing moat is described by Higgs and Humenick in U.S. Pat. No. 4,578,692 issued Mar. 25, 1986.

The amplifier itself would ideally produce an output voltage of zero when the amplifier input is zero, but as a practical matter, the amplifier generally has an offset voltage (with zero input voltage) that is for example owing to imbalances in pairs of transistors and pairs of resistors.

In his patent U.S. Pat. No. 4,709,214 issued Nov. 24, 1987, Higgs reduces the offset voltage of the Hall voltage amplifier by employing an extraordinarily large pair of differential amplifier transistors and positioning them on the chip symmetrically about an axis of the heat generating Hall element.

The input voltage of a Schmitt trigger circuit at which its output changes from a first level to another (often referred to as the operate voltage) varies from one integrated circuit to another again due to such factors as variation from chip to chip of transistor parameters and resistor values. The production of more predictable integrated Schmitt trigger circuits is accomplished as described in the U.S. Pat. No. 4,705,964 issued to Higgs that issued Nov. 10, 1987. This method calls for an adjustment of resistor values at the end of chip manufacture to compensate all Schmitt trigger offset factors.

In dual-Hall ferrous-article proximity sensors, Higgs and Gibson first recognized and provided a partial solution to a fourth factor contributing to overall offsets: namely, the magnetic field strength is generally not uniform over the pole end of a magnet, although it shows some symmetry about the magnet axis. And, shape of the magnetic field strength varies from magnet to magnet. Such problems are disclosed by Higgs and Gibson in their patent U.S. Pat. No. 4,859,941 issued Aug. 22, 1989. Thus to arbitrarily mount the dual Hall integrated circuit chip just anywhere on the magnet pole end invariably leads to an offset contribution due to the different field strengths at the first and second of the Hall elements respectively. A more microscopic view of the field at the pole end of a magnetic field reveals a random noise-like pattern of field strength superimposed on the roughly symmetrical profile. The solution provided in the patent is to sandwich a ferrous pole piece of particular shape between the magnet and the chip to flatten and smooth the irregularities in magnet generated field seen by the chip. A typical assymmetrical magnet field as a function of position at a pole end is shown as curve S in FIG. 1 or it may be closer to symmetrical as illustrated by curve M.

The same problem is addressed in a similar way by Kawaji and Gilbert in their patent application U.S. Pat. No. 4,935,698 issued June 19, 1990.

Integrated circuit chips containing the dual Hall elements are usually protected by encapsulation in a plastic package before being mounted on a magnet for ferromagnetic article sensing. Various degrees of tipping of the chip in the package or the package on the magnet can occur leading to offset in the output signal.

The five above-noted patents are assigned to the same assignee as is the present invention.

Reduction of the elemental sources of overall integrated circuit offset voltage, by one or all of the patented approaches noted above may be advantageous in combination with the features of the present invention. However, reduction of those elemental sources alone cannot as a practical matter be accomplished in such a way as to compensate for all the sources of offset.

It is an object of the present invention to provide a method for making a dual-Hall ferrous-article proximity sensor wherein the offset from each of the above-noted sources are self-compensating.

It is another object of the present invention to provide a dual Hall ferrous-article proximity detector that has an output voltage with one parameter meeting a predetermined criteria that accounts for all sources of offset voltage therein.

SUMMARY OF THE INVENTION

A proximity sensor of ferromagnetic articles is comprised of a magnet, an integrated circuit chip of the kind including two spaced apart Hall elements and a circuit means for generating a signal that is a function of the difference between the outputs of one and the other of said two Hall elements. The chip is mounted to or in some fashion fixed with respect to one pole end of the magnet after the magnet has been rotated eccentrically about the chip axis and stopped in a position relative to the magnet at which one parameter of the signal has reached a predetermined target value.

This invention turns a prior art problem into an advantage: namely, the recently recognized problem that all magnets exhibit an unpredictable assymetrical field component plus a randomly varying field component across each pole end. The invention exploits this non-uniformity in the field at a pole end of a magnet.

In one aspect of the invention, the circuit means includes only a differential amplifier, the predetermined signal parameter is the amplitude of the output signal, and the target value is zero.

In another aspect of the invention the circuit means includes a Schmitt trigger circuit and, when a rotating tooth gear of a high permeability material is placed adjacent the magnet pole end with the chip located therebetween during the moving of the chip over the pole end to produce an alternating binary signal, the stopping and bonding or otherwise fixedly attaching of the chip to the pole end is effected when the predetermined signal parameter is the duty factor, and when the predetermined target value of the duty factor is about 50%, namely that of the gear teeth themselves.

Thus in these two respective cases, the proximity sensor generates an output signal that is, in the first case, zero amplitude in the absence of a nearby ferromagnetic article. In the other case the proximity sensor generates an output binary signal that in response to an adjacent rotating high perm toothed gear, has a duty factor of 50%. With equal width teeth and spaces between the teeth not only does the duty factor of the sensor output equal that of gear teeth for one gear-to-sensor spacing but at all gap dimensions for which tooth detection is effected at all.

In both cases, all of the factors that contribute to an offset level of the proximity sensor output are mutually self-cancelling and at an optimum (target) value for purposes of the intended use. In the first case the zero offset or zero output signal level indicates the absence of any nearby field distorting ferrous article. In the second case the 50% duty factor output voltage level is ideal for use in providing a reliable electrical signal measure of the speed (frequency) of passage of gear teeth.

The chip axis is defined as being orthogonal to a major face of the chip and being equidistant from the two Hall elements. In a preferred sensor package of this invention the chip is fixedly mounted at the end of a cylindrical tube with the chip axis and tube axis being coincident. The magnet is fixedly encased in a separate housing with a cylindrical portion that is of commensurate dimensions with the inside of the cylindrical tube and thus can be mated with and rotatable in said tube. The magnet axis and cylindrical housing axis are spaced apart but parallel. Thus the sensor assembly is made by mating the cylindrical housing with and in the cylindrical tube, rotating the now eccentrically-held magnet about the chip axis until the above-noted one signal parameter reaches the predetermined target value, and mechanically fastening the cylindrical housing to the cylindrical tube.

This amounts to a simple manufacturing procedure, no adhesive stress need be applied to the stress-sensitive IC chip package at the very point of signal parameter adjustment, the off-center rotation may optimally exploit the usual peaking of magnetic field strength near the magnet axis, and it avoids the possibility that rotation of the magnet coaxially with the chip axis will produce no change in the sensor signal parameter.

Thus for any particular application, a sensor of this invention may be made having a near ideal amount of total offset or bias value in the output signal, merely by moving and finding an appropriate mounting position for the dual Hall IC chip at the magnet pole end.

BRIEF DESCRIPTION OF THE DRAWING

FIG. 1 shows a plot M representing the roughly symmetric axially directed magnetic field amplitude profile at a pole end of a typical magnet. Plot S represents the strongly assymetric pole end field amplitude of a magnet according to one aspect of this invention.

FIG. 2 shows in side sectional view a first embodiment of a sensor assembly of this invention, the magnet being shown whole.

FIG. 3 shows a curve A representing the axially directed magnetic field amplitude at the plane of the two Hall elements in a sensor assembly of this invention.

FIG. 4 shows in bottom view, the sensor assembly of FIG. 2.

FIG. 5 shows a detail side sectional view of a portion of the sensor assembly of FIG. 2 modified by insertion of a field distorting member between the magnet and the IC chip.

FIG. 6 shows a block diagram of a dual Hall integrated circuit of this invention with the two outputs of the two Hall elements connected series-opposing to a differential Hall voltage amplifier.

FIGS. 7, 9, 11 and 13 show in top sectional view the sensor assembly of FIG. 2 taken in section 7-7 with various positions of the magnet relative to the assembly and chip axis 18.

FIGS. 8, 10, 12 and 14 show graphs of magnet generated field strength at the chip package 10 corresponding respectively to sensor assemblies of FIGS. 7, 9, 11 and 13.

DESCRIPTION OF THE PREFERRED EMBODIMENTS

The sensor assembly 2 depicted in FIG. 2 is composed of two subassemblies. An integrated circuit package 10 is mounted in a plastic tube 24 to form the chipholding subassembly 11, and a magnet 30 is mounted in a plastic base 32 to form the magnet-holding subassembly 31.

The integrated circuit package 10 is comprised of a plastic encapsulated silicon integrated circuit chip 12 of the kind having two Hall elements 14 and 16 formed in a top surface of the silicon chip 12. Hall elements 14 and 16 therefore lie in the plane 20 and a chip axis 18 is orthogonal to plane 20 and is equidistant with respect to the Hall elements 14 and 16. Subassembly 11 is symmetrical with reference to this chip axis 18 as seen in FIGS. 2, 5 and 6.

The cylindrical magnet 30 is not symmetrically positioned with respect to the chip axis 18 whereas the major lower portion of the magnet holding plastic piece 32 is cylindrical and is symmetrical with respect to axis 18. Both subassemblies 11 and 31 as shown here have cylindrical plastic outer sidewalls of the same outside diameter and symmetrical about chip axis 18. In general however, their outside shapes and dimensions may differ from each other so long as some portion remains concentric about the chip axis 18.

In a central region 25 of the assembly 2, a cylindrical female portion of subassembly 11 is mated and snugly fits a cylindrical male portion of subassembly 31. These mating cylindrical portions are coaxial with respect to chip (and assembly) axis 18. Rotation of the subassembly 31 with respect to subassembly 11 causes the offset magnet axis 34 to revolve around the chip (and assembly) axis 18 as indicated by the arrow 33 in FIGS. 9 and 13. The recess 36 in the bottom of the magnet-holding subassembly 31, as seen in FIG. 4, is for inserting a screwdriver blade or other tool to assist in effecting that relative rotation. A view of the offset magnet 30 in four positions of rotation relative to the plastic tube 24 is had in FIGS. 7, 9, 11 and 13.

Directly under each of the FIGS. 7, 9, 11 and 13 are FIGS. 8, 10, 12 and 14, respectively. Curve 60 is the plot of axially directed magnetic field strength at the dual package 12. The center line C in the four graphs of FIGS. 8, 10, 12 and 14 are aligned with the magnet axis 34 in the corresponding FIGS. 7, 9, 11 and 13.

The magnet axis 34 is directly above the chip axis 18 in FIG. 7 and the field strengths, points 62 and 64 in FIG. 8, at each of the Hall elements 14 and 16 are equal. When the magnet is rotated 90 degrees as shown in FIG. 9, the field strength at Hall element 16 corresponding to point 68 in FIG. 10 is substantially larger than at Hall element 14 corresponding to point 66.

After another 90-degree rotation as seen in FIG. 11, the field strengths of points 70 and 72 are again equal at the Hall elements 14 and 16. And rotating the magnet another 90 degrees as seen in FIG. 13 results in a larger field strength at Hall element 14 than at Hall element 16 corresponding to points 74 and 76, respectively, in FIG. 14.

Referring to FIG. 3, curve A represents the magnitude B of axially directed magnet field at the plane 20 of the Hall elements 14 and 16 as a function of position with respect to a side profile, as in FIG. 2, of the sensor assembly 2.

It can now be appreciated that this FIG. 2 side profile and the other side profiles of the cylindrical assembly 2 (not shown) are a true indication of the location of the axis 18 of dual Hall IC chip 12 that may be encapsulated within the assembly since the central chip axis 18 is coincident and synonymous with the axis 18 of the cylindrical assembly 2. This makes it possible, for any position at which the sensor assembly 2 may be mounted, to know exactly where the dual Hall chip axis 18 is located, i.e. with respect to a rotating ferromagnetic toothed gear or other moving ferromagnetic article.

It is not necessary however that an assembly of this invention have a uniform side profile or side walls as in the assembly 2 of FIG. 2. Only one outside region, e.g. the central mating region 25 or the low region 38 or the high region 40, of the sensor assembly need be uniform and coaxial about the chip axis 18 to serve as the needed indication of the chip axis position.

Furthermore, that uniform-walls chip-position-indicating region of the sensor assembly need not be cylindrical. For example, it may be square, rectangular, triangular, elliptical or otherwise so long as a central axis of that shape is unambiguously definable.

The integrated circuit chip may simply include the two Hall elements 14 and 16 having their outputs differentially interconnected by any of the well-known circuit arrangements by which such differential connections are made. In this embodiment however, the assembly 2 includes a chip 12 having a Hall-voltages differential amplifier 42 followed tandemly by a Schmitt trigger circuit 44 that is further illustrated in FIG. 6. The three chip terminals 45, 47 and 48 (FIG. 6) correspond to the ground lead 45, energizing voltage ($V_{cc}$) lead 47, and the output lead 49, respectively in FIG. 7. Such a dual Hall integrated circuit chip provides a binary output signal that changes state e.g. from the first voltage to the second voltage when the amplitude difference between the magnetic fields that are at the two Hall elements, respectively, normal to the Hall-elements plane (e.g. 20) exceeds a predetermined value (e.g. in gauss).

If an analog output signal is wanted (e.g. that is an analog function of the difference in Hall fields amplitudes), then the Schmitt trigger circuit may be eliminated and the amplifier connected directly to the output terminal 49.

Thus, in the assembly 2 including a dual Hall integrated circuit chip 12 wherein the offset voltages associated with the Hall elements, the amplifier and the Schmitt trigger circuit are not known, and including a magnet wherein the variations in magnitude of the axially directed magnetic field at the upper (not shown) pole end are not known, the chip-holding subassembly 11 may be rotated with respect to the magnet-holding subassembly until a parameter in the chip output voltage equals a predetermined target value.

In the case wherein the output voltage is the output of the differential amplifier, rotation of subassembly 11 with respect to subassembly 31 may be stopped when the output voltage is zero. Such an adjustment provides a perfect cancellation of the offset voltages associated with the chip by actually the adjusted (by the rotation) difference of axially directed magnetic fields at the two Hall elements. In other cases it may be desired to adjust (by rotation) the mating subassemblies 11 and 31 to provide a particular voltage of one polarity or the other.

In the embodiment of a proximity sensor assembly shown in FIG. 5 a high-magnetic-permeability, i.e. feromagnetic wedge-shaped disc 39 is interposed between the IC chip package 10 and the pole end in plane 29 of magnet 30. The disc 39 is to provide additional assymetry in the magnetic field in the chip package 10 in those cases wherein the magnet itself provides too little. More generally, a field-distorting disc such as disc 39, may have patterns of non-uniform magnetic reluctance using hole patterns. Even a wedge of non-ferrous material, such as plastic, may be used. Such tipping of the chip tends to degrade sensitivity and a wedge angle of less than 10 degrees is preferred.

Sensor assembly 2 of FIG. 7, may be made by placing the chip package 10 directly on a pole end of a magnet 30 with chip axis 18 and magnet axis 34 spaced apart with a film of a liquid bonding agent therebetween. The chip package 10 is then rotated while the liquid bonding agent is still wet until the chosen parameter of the chip output voltage reaches the predetermined target value. This has exactly the same effect as the above-described rotation of the magnet axis about the chip axis. The bonding agent is then cured. There are many other means for fixing the physical relationship of the chip package 10 and magnet 30 including applying a bonding agent at one or more edges of the chip package after the rotation is stopped. Any bonding agent should be applied sparingly to reduce the chances that stresses on the package 10 and thus the chip 12 will alter offset voltages of the Hall elements 14 and 16 during cure of the bonding agent.

What is claimed is:

1. A proximity sensor assembly of a magnet and a dual Hall integrated-circuit chip comprising:
   a) an integrated-circuit chip including two spaced apart Hall elements formed in one face of said chip, said chip having an axis orthogonal to said one face and equidistant from said two Hall elements, and a differential Hall voltage circuit means connected series opposing to the two outputs of said two Hall elements, respectively, for providing an output signal with one parameter that is a function of he differential voltage between said Hall element outputs;
   b) a first housing having a cylindrical hole, said dual Hall chip fixedly mounted at one end of said hole with said chip axis coincident with the axis of said cylindrical hole;
   c) a magnet;
   d) a second housing having a cylindrical portion enclosing and holding said magnet with the north-south axis of said magnet parallel to but spaced away from the axis of said cylindrical housing;
   said cylindrical portion of said second housing having been snugly fitted into and rotated in said hole of said first housing until the circuit means output signal parameter equals a predetermined target value,
   said second housing being fixedly fastened to said first housing.

2. The proximity sensor assembly of claim 1 wherein a portion of the outer wall of said first housing si cylindrical with an axis that is coincident with the axis of said dual Hall chip.

3. The proximity sensor assembly of claim 1 wherein an exposed portion of the outer wall of said second housing is cylindrical with an axis that is coincident with the axis of said dual Hall chip.

4. The proximity sensor assembly of claim 1 additionally comprising a ferromagnetic pole piece mounted to a pole end of said magnet and located between said pole end and said chip, said pole piece having a variable magnetic reluctance from point to point therein to induce asymmetry about said magnet axis into the magnetic field at said pole end.

5. The proximity sensor assembly of claim 4 wherein said pole piece is a thin ferromagnetic wedge.

* * * * *